United States Patent
Lee et al.

(10) Patent No.: US 7,670,761 B2
(45) Date of Patent: Mar. 2, 2010

(54) METHOD OF FORMING A FINE PATTERN OF A SEMICONDUCTOR DEVICE USING A RESIST REFLOW MEASUREMENT KEY

(75) Inventors: Doo-youl Lee, Seoul (KR); Gi-sung Yeo, Seoul (KR); Han-ku Cho, Seongnam-si (KR); Jung-hyeon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 12/219,214

(22) Filed: Jul. 17, 2008

(65) Prior Publication Data
US 2008/0280381 A1 Nov. 13, 2008

Related U.S. Application Data

(62) Division of application No. 10/937,398, filed on Sep. 10, 2004, now abandoned.

(30) Foreign Application Priority Data
Sep. 29, 2003 (KR) .................................. 03-67434

(51) Int. Cl.
G03F 1/00 (2006.01)
(52) U.S. Cl. .................. 430/330; 430/30; 430/312; 430/322; 257/E21.023; 257/E21.026; 257/E21.529
(58) Field of Classification Search .................. 430/30, 430/312, 322, 330; 257/E21.023, E21.026, 257/E21.529
See application file for complete search history.

(56) References Cited

U.S. PATENT DOCUMENTS 6,088,113 A  7/2000  Kim

| | | |
|---|---|---|
| 2001/0003054 A1 | 6/2001 | Sumitani |
| 2001/0008809 A1 | 7/2001 | Saito |
| 2002/0182516 A1 | 12/2002 | Bowes |
| 2002/0197542 A1 | 12/2002 | Lai et al. |

(Continued)

FOREIGN PATENT DOCUMENTS

| | | |
|---|---|---|
| JP | 2000-232057 | 8/2000 |
| JP | 2003-045767 | 1/2003 |
| KR | 10-2000-0051433 | 8/2000 |
| KR | 10-2002-0002926 | 1/2002 |

OTHER PUBLICATIONS

Wolf & Tauber, Silicon Processing for the VLSI Era, vol. 1: Process Technology, Lattice Press: Sunset Beach, California (US) Chapter 12, pp. 407-458 (1986).
Jackson, K.A. and Schröter, W., Editors, Handbook of Semiconductor Technology: Processing of Semiconductors, vol. 2, Wiley-VCH, New York, (US), p. 184 (2001).

*Primary Examiner*—Thorl Chea
(74) *Attorney, Agent, or Firm*—Lee & Morse, P.C.

(57) ABSTRACT

In a resist reflow measurement key, and method of fabricating a fine pattern of a semiconductor device using the same, the resist reflow measurement key includes a first reflow key including a plurality of first pattern elements each having a first pattern with a first radius of curvature located on a first side of a first center line and a second pattern with a second radius of curvature located on a second side of the first center line, and a second reflow key including a plurality of second pattern elements each having a third pattern with a third radius of curvature located on a first side of a second center line and a fourth pattern with a fourth radius of curvature located on a second side of the second center line, the second reflow key being formed on a same plane of a substrate as the first reflow key.

20 Claims, 4 Drawing Sheets

U.S. PATENT DOCUMENTS

| | | |
|---|---|---|
| 2003/0008242 A1 | 1/2003 | Schedel et al. |
| 2003/0031943 A1 | 2/2003 | Nakao et al. |
| 2003/0141606 A1 | 7/2003 | Yusa et al. |
| 2004/0253551 A1 | 12/2004 | Shibata et al. |
| 2005/0147928 A1 | 7/2005 | Frost et al. |
| 2005/0250026 A1 | 11/2005 | Yamaguchi et al. |

METHOD OF FORMING A FINE PATTERN OF A SEMICONDUCTOR DEVICE USING A RESIST REFLOW MEASUREMENT KEY

CROSS REFERENCE TO RELATED APPLICATION(S)

This is a divisional application based on application Ser. No. 10/937,398, filed Sep. 10, 2004, now abandoned the entire contents of which is hereby incorporated by reference.

BACKGROUND OF THE INVENTION

1. Field of the Invention

The present invention relates to a measurement key used in semiconductor device fabrication and a method of fabricating a semiconductor device using the same. More particularly, the present invention relates to a resist reflow measurement key used for measuring the flow of resist and a method of forming a fine pattern of a semiconductor device using the same.

2. Description of the Related Art

Due to widespread demand for semiconductor devices having an increased processing speed and highly integrated memory devices for use in a wide range of electronic devices, there is a need to develop a circuitry product having a sub-micron size. To satisfy this need in highly integrated devices, efforts to develop an improved photoresist composition have been accelerated. Moreover, efforts to obtain a pattern having more precise dimensions to obtain, in particular, a pattern suitable for a structure having a minimum feature size have been accelerated. To fabricate highly integrated semiconductor devices successfully, it is necessary to form more precisely and finely a photoresist pattern widely used in etch and ion implantation processes. To realize these products, a sensitive photoresist is required. However, use of a sensitive photoresist is necessarily accompanied by an additional process, which is complicated.

In a semiconductor fabrication process using a single layer resist and a 0.13 μm process, ArF lithography technology is used. It is forecast, however, that greater precision and dimension control will be required for a process below 0.10 μm, which will be used in the future.

The wavelength of a light source for exposure directly influences the minimum resolution that can be obtained in an exposure apparatus. For instance, in forming a fine line and space (L/S) pattern, a g-line exposure apparatus has a resolution limit of about 0.5 μm and an i-line exposure apparatus has a resolution limit of about 0.3 μm. The recent trend, however, shows that the device design rule is approaching an L/S measurement value below about 0.2 μm. It is forecast that the allowable minimum feature size in a next generation device design rule will continue to decrease. In particular, in fabricating a highly integrated device that requires a small contact hole having a high aspect ratio in an L/S pattern having a fine critical dimension (CD), or a cell array region of a device, various processes to overcome the resolution limit of exposure apparatuses have been developed. A reflow process using heat is one example of such a process.

In a reflow process using heat, an initial photoresist pattern having formed therein a contact hole, which has a size larger than the CD of a final US pattern or the size of a contact hole to be formed, is first formed. Then, the formed photoresist pattern is heated to a temperature above the glass transition temperature (Tg) of the photoresist and is reflowed to form a fine pattern. The heating reduces the viscosity of the linked photoresist to reflow the photoresist. Thus, the CD of the US pattern or the size of the contact hole is reduced, thereby obtaining a desired fine pattern.

In the reflow process, the CD of the reflowed resist pattern is monitored at the after flow inspection (AFI) stage. The exposure dose is controlled on the basis of the CD value measured in the AFI stage. In the process of controlling the CD of the resist pattern in the aforementioned manner, the amount of time required to monitor the CD of the reflowed resist pattern in the AFI stage is very important because it influences the throughput of the whole exposure process.

Until recently, monitoring the CD of the reflowed resist pattern involved measuring the CD of the reflowed resist pattern using a scanning electron microscope (SEM) in the AFI stage. In other words, in applying the present reflow process using heat, the resist pattern, which is reflowed in the AFI stage, is monitored by an SEM and an exposure dose is controlled on the basis of the monitored result. Thus, it takes a significant amount of time to perform a process that can satisfy a desired CD size since the monitoring in the post-development baking (PDB) step, i.e., in the reflow step of the resist, depends only on the CD measurement using the SEM. As a result, performing the CD monitoring on the entire region of a wafer takes too long, thereby significantly reducing throughput as a size of the wafer increases.

SUMMARY OF THE INVENTION

The present invention is therefore directed to a resist reflow measurement key and a method of forming a fine pattern of a semiconductor device using the same, which substantially overcome one or more of the problems due to the limitations and disadvantages of the related art.

It is a feature of an embodiment of the present invention to provide a resist reflow measurement key that enables the flow of a reflowed resist pattern to be quantitatively monitored within a very short time in forming a fine pattern to overcome the resolution limit of an exposure apparatus by a reflow process using heat.

It is another feature of an embodiment of the present invention to provide a method of forming a fine pattern to overcome the resolution limit of an exposure apparatus by a process set to quantitatively monitor the flow of a reflowed resist pattern within a very short time in forming a fine pattern of a semiconductor device by a reflow process using heat.

It is still another feature of an embodiment of the present invention to provide a resist reflow measurement key and a method of forming a fine pattern of a semiconductor device using the same that is able to monitor the flow of the resist pattern on the wafer in an AFI step within a very short time to improve throughput when the process is performed on wafers having a relatively large size.

It is yet another feature of an embodiment of the present invention to provide a resist reflow measurement key and a method of forming a fine pattern of a semiconductor device using the same that is able to obtain feedback rapidly in the reflow process of the resist pattern, decrease AFI monitoring turn around time (TAT), and enhance pattern uniformity according to the position on the wafer.

At least one of the above and other features and advantages of the present invention may be realized by providing a resist reflow measurement key including a first reflow key disposed on a substrate around a first center point, the first reflow key including a plurality of first pattern elements each having a first pattern with a first radius of curvature located on a first side of a first center line extending in a lengthwise direction of each of the plurality of first pattern elements and a second pattern with a second radius of curvature located on a second side of the first center line, which is opposite to the first side of the first center line, and a second reflow key disposed on the substrate around a second center point, the second reflow key including a plurality of second pattern elements each having a third pattern with a third radius of curvature located on a first side of a second center line extending in a lengthwise direction of each of the plurality of second pattern elements and a fourth pattern with a fourth radius of curvature located on a second side of the second center line, which is opposite to the first side of the second center line, the second reflow key being formed on a same plane as the first reflow key.

The first reflow key may have a rectangular shape and the plurality of first pattern elements may be four first pattern elements, each one of the four first pattern elements constituting a side of the rectangular shaped first reflow key.

The second reflow key may have a rectangular shape and the plurality of second pattern elements may be four second pattern elements, each one of the four second pattern elements constituting a side of the rectangular shaped second reflow key.

The first pattern of each of the plurality of first pattern elements may be a plurality of first pattern shape portions positioned at the first side of the first center line and having the first radius of curvature, and the second pattern of each of the plurality of first pattern elements may be a plurality of second pattern shape portions positioned at the second side of the first center line and having the second radius of curvature, which is larger than the first radius of curvature, and the third pattern of the plurality of second pattern elements may be a plurality of third pattern shape portions positioned at the first side of the second center line and having the third radius of curvature, and the fourth pattern of the plurality of second pattern elements may be a plurality of fourth pattern shape portions positioned at the second side of the second center line and having the fourth radius of curvature, which is larger than the third radius of curvature.

The plurality of first pattern elements may be respectively arranged such that the plurality of second pattern shape portions is disposed facing a first direction of a line extending diagonally through the first center point, and the plurality of second pattern elements may be respectively arranged such that the plurality of fourth pattern shape portions is disposed facing a second direction, which is opposite to the first direction, of a line extending diagonally through the second center point.

The first and second reflow keys may be respectively arranged such that at least one of the plurality of first pattern shape portions of the plurality of first pattern elements faces a corresponding one of the plurality of third pattern shape portions of the plurality of second pattern elements.

The first reflow key and the second reflow key may be respectively arranged such that at least one of the plurality of second pattern shape portions of the plurality of first pattern elements faces a corresponding one of the plurality of fourth pattern shape portions of the plurality of second pattern elements.

The first reflow key and the second reflow key may be respectively arranged such that at least one of the plurality of first pattern shape portions of the plurality of first pattern elements faces a corresponding one of the plurality of third pattern shape portions of the plurality of second pattern elements and at least one of the plurality of second pattern shape portions of the plurality of first pattern elements faces a corresponding one of the plurality of fourth pattern shape portions of the plurality of second pattern elements concurrently.

The first radius of curvature and the third radius of curvature may be the same. The second radius of curvature and the fourth radius of curvature may be the same.

The second reflow key may have a size smaller than a size of the first reflow key. The second reflow key may be formed in a region defined by the first reflow key.

The first and second reflow keys may each be of a trench type pattern. The first and second reflow keys may each be of a mesa type pattern.

The first reflow key and the second reflow key are formed of a material selected from positive photoresist and negative photoresist.

At least one of the above and other features and advantages of the present invention may be realized by providing a method of forming a fine pattern of a semiconductor device including forming a resist pattern on a semiconductor substrate to form a pattern having a predetermined shape, forming a resist reflow measurement key on the semiconductor substrate while forming the resist pattern, reflowing the resist pattern and the resist reflow measurement key at the same time, measuring a variation in a position of a first center point of the reflowed resist reflow measurement key and a variation in a position of a second center point of the reflowed resist reflow measurement key by using an optical overlay measurement apparatus, and determining a critical dimension of the reflowed resist pattern from measurement values of the variation in the position of the first center point and the variation in the position of the second center point.

The pattern having the predetermined shape may be a contact hole pattern or a line and space pattern.

The optical overlay measurement apparatus may be a laser scan alignment (LSA) type overlay measurement apparatus or a field image alignment (FIA) type overlay measurement apparatus.

The resist pattern and the resist reflow measurement key may be formed of an identical material.

The semiconductor substrate may include a device region where an actual device is formed and a test element group (TEG) region where a test device for measuring an electrical property of the actual device is formed, the resist pattern being formed in the device region, and the resist reflow measurement key being formed in the TEG region.

According to an embodiment of the present invention, after the reflow process of the resist pattern formed on the device region of the wafer is performed, a variation in a position of a center point due to the flow in the resist reflow measurement key reflowed concurrently with the resist pattern is measured in the AFI step using an overlay measurement apparatus to monitor the CD of the resist pattern. Accordingly, the flow of the resist pattern on the wafer in AFI step can be monitored within a very short time, thereby improving throughput when the process is performed on wafers having a relatively large sized. Also, in the reflow process of the resist pattern, feedback can be rapidly obtained, AFI monitoring turn around time (TAT) can be shortened, and pattern uniformity according to the position on the wafer can be enhanced.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
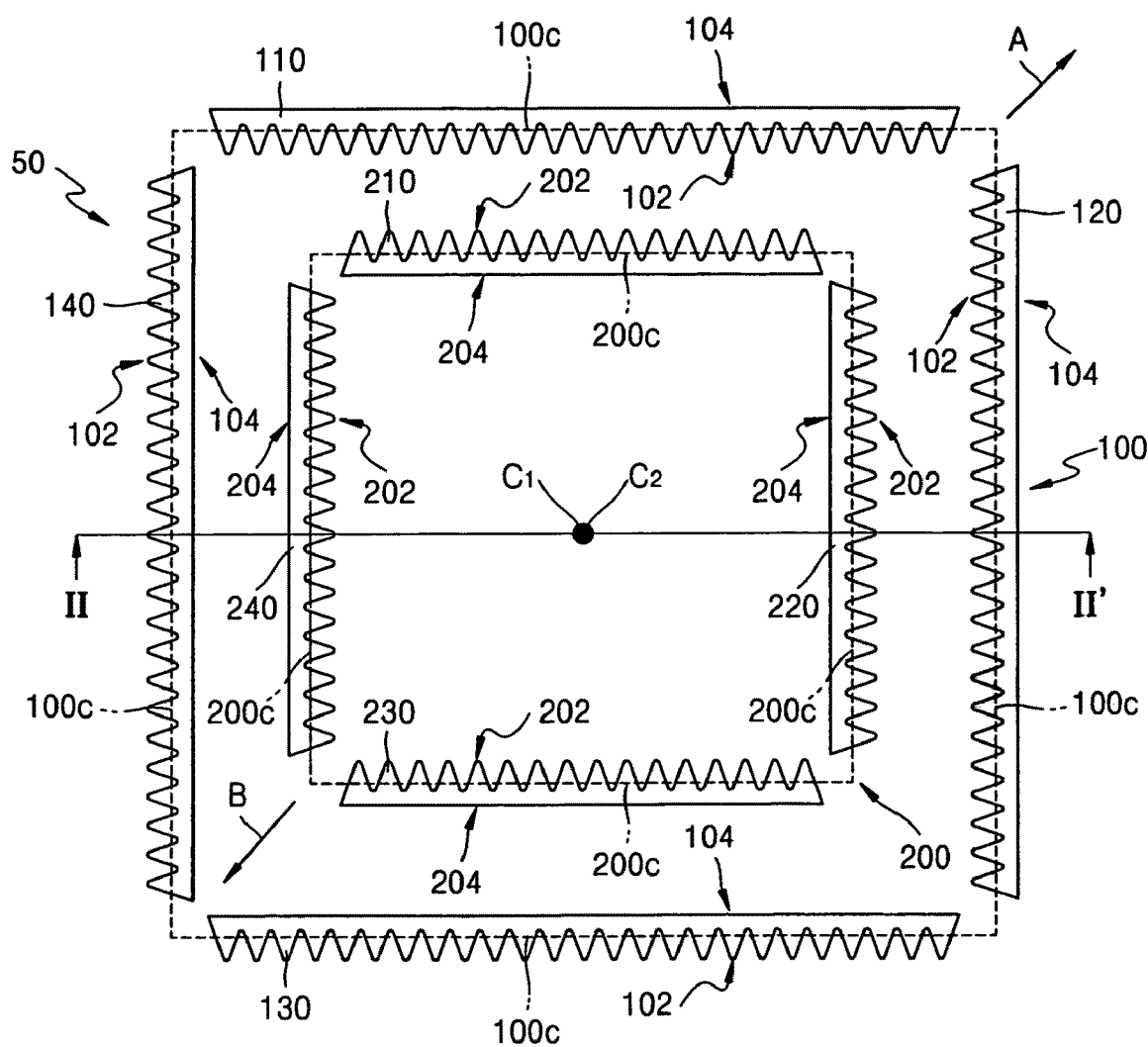
FIG. 1 illustrates a plan view of a resist reflow measurement key according to an embodiment of the present invention.

Korean Patent Application No. 2003-67434, filed on Sep. 29, 2003, in the Korean Intellectual Property Office, and entitled: "Resist Reflow Measurement Key and Method of Forming a Fine Pattern of a Semiconductor Device Using the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Like reference numerals refer to like elements throughout.

FIG. 1 illustrates a plan view of a resist reflow measurement key 50 according to an embodiment of the present invention.

Referring to FIG. 1, a resist reflow measurement key 50 according to an embodiment of the present invention includes a first reflow key 100 including a plurality of first pattern elements 110, 120, 130, 140 and a second reflow key 200 including a plurality of second pattern elements 210, 220, 230, 240.

The plurality of first pattern elements 110, 120, 130, and 140 constituting the first reflow key are arranged around on a first center point $C_1$ on a semiconductor substrate. The plurality of first pattern elements 110, 120, 130, and 140 have pattern shapes having different radii of curvature at opposite sides of a first center line 100c extending in a lengthwise direction of each of the plurality of first pattern elements 110, 120, 130, and 140. In other words, each of the plurality of first pattern elements 110, 120, 130, and 140 includes a first pattern shape portion 102 positioned at a first side of and extending in the lengthwise direction of the first center line 100c. The first pattern shape portion 102 has a first curvature radius. Each of the plurality of first pattern elements 110, 120, 130, and 140 further includes a second pattern shape portion 104 positioned at a second side of the first center line 100c, which is opposite to the first side. The second pattern shape portion 104 has a second radius of curvature, which is larger than the first radius of curvature. In FIG. 1, the second pattern shape portion 104 is shaped as a substantially straight line and thus has an infinite radius of curvature.

The plurality of second pattern elements 210, 220, 230, and 240 constituting the second reflow key 200 are arranged on a same plane as the plurality of first pattern elements 110, 120, 130, and 140 and are arranged around a second center point $C_2$ on the semiconductor substrate. The plurality of second pattern elements 210, 220, 230, and 240 have pattern shapes having different radii of curvature at opposite sides of a second center line 200c extending in a lengthwise direction of each of the plurality of second pattern elements 210, 220, 230, and 240. In other words, each of the plurality of second pattern elements 210, 220, 230, and 240 includes a third pattern shape portion 202 positioned at a first side of and extending in the lengthwise direction of the second center line 200c. The third pattern shape portion 202 has a third radius of curvature. Each of the plurality of second pattern elements 210, 220, 230, and 240 further includes a fourth pattern shape portion 204 positioned at a second side of the second center line 200c, which is opposite to the first side. The fourth pattern shape portion 204 has a fourth radius of curvature, which is larger than the third radius of curvature. In FIG. 1, the fourth pattern shape portion 204 is shaped as a substantially straight line and thus has an infinite radius of curvature.

Although in the embodiment illustrated in FIG. 1 the first center point $C_1$ of the first reflow key 100 and the second center point $C_2$ of the second reflow key 200 are shown as positioned at the same site, the first center point $C_1$ and the second center point $C_2$ may be positioned at different sites. In particular, a position of the first center point $C_1$ of the first reflow key 100 and a position of the second center point $C_2$ of the second reflow key 200 may be moved according to a reflow tendency of the first and second reflow keys 100 and 200 after the respective reflow processes, which will be described later.

The first reflow key 100 and the second reflow key 200 are formed of a photoresist material. Positive photoresist or negative photoresist may be selectively used as the photoresist material of the first and second reflow keys 100 and 200. The first reflow key 100 and the second reflow key 200 may be formed in a test element group (TEG) region where a test device for measuring an electrical property of the actual device formed on a device region of the semiconductor substrate is formed. Also, the first reflow key 100 and the second reflow key 200 may be formed of the same material as a resist pattern formed as a mask pattern for forming a desired pattern on the device region.

In the exemplary embodiment shown in FIG. 1, the plurality of first pattern elements 110, 120, 130 and 140 is four first pattern elements 110, 120, 130 and 140, each constituting a side of the first reflow key 100, which is shown having a rectangular shape. Similarly, the plurality of second pattern elements 210, 220, 230 and 240 is four second pattern elements 210, 220, 230 and 240, each constituting a side of the second reflow key 200, which also has a rectangular shape. Although FIG. 1 illustrates the first reflow key 100 and the second reflow key 200 having a rectangular shape, the first reflow key 100 and the second reflow key 200 are not limited to that shape and may be have various other shapes.

By way of further alternative, although FIG. 1 illustrates the second reflow key 200 having a size smaller than the first reflow key 100 and being formed within a region defined by the first reflow key 100, the present invention is not limited to this particular arrangement.

The first pattern elements 110, 120, 130, and 140 of the first reflow key 100 may be arranged such that the portion having a larger radius of curvature, i.e., the second pattern shape portion 104, is disposed on a side facing a first predetermined direction, e.g., a direction indicated by an arrow "A", of a line extending diagonally through the first center point $C_1$. In addition, the second pattern elements 210, 220, 230, and 240 of the second reflow key 200 may be arranged such that the portion having a larger radius of curvature, i.e., the fourth pattern shape portion 204, is disposed on a side facing a second predetermined direction, which is opposite to the first direction, e.g., a direction indicated by an arrow "B," which is opposite to the arrow "A" direction, of a line extending diagonally through the second center point $C_2$.

In the exemplary construction of the first and second reflow keys 100 and 200 shown in FIG. 1, the first and second reflow keys 100 and 200 are arranged such that two of the plurality of first pattern shape portions 102 of the first pattern elements 110 and 120 face a corresponding two of the plurality of third pattern shape portions 202 of the second pattern elements 210 and 220. Concurrently, the first reflow key 100 and the second reflow key 200 are arranged such that two of the plurality of second pattern shape portions 104 of the first pattern elements 130 and 140 face a corresponding two of the plurality of fourth pattern shape portions 204 of the second pattern elements 230 and 240.

In the above-described arrangement for the second pattern shape portion 104 of the first pattern elements 110, 120, 130, 140 to exist at the side facing the arrow "A" direction and for the fourth pattern shape portion 204 in the second pattern elements 210, 220, 230, 240 to face the direction indicated by the arrow "B", the first reflow key 100 and the second reflow key 200 may be arranged such that an area where the first pattern shape portion 102 of the first pattern elements 110 and 120 faces the third pattern shape portion 202 of the second pattern elements 210 and 220 and an area where the second pattern shape portion 104 of the first pattern elements 130 and 140 faces the fourth pattern shape portion 204 of the second pattern elements 230 and 240 coexist.

As shown in FIG. 1, in the arrangement that the second pattern shape portion 104 having the relatively larger radius of curvature in the first pattern elements 110, 120, 130, 140 faces in the "A" direction and the fourth pattern shape portion 204 having the relatively larger radius of curvature in the second pattern elements 210, 220, 230, 240 faces in the "B" direction, after the reflow process for the photoresist pattern formed on the device region is performed, the resist reflow measurement key 50 including the first reflow key 100 and the second reflow key 200 is also reflowed concurrently with the reflow of the resist pattern. At this time, the resist of the first pattern shape portion 102 and the third pattern shape portion 202, which have the relatively smaller radius of curvature, flows more than the resist of the second pattern shape portion 104 and the fourth pattern shape portion 204, which have the relatively larger radius of curvature.

A relationship between the radius of curvature of the resist pattern and an amount of flow will now be described in detail.

Generally, when a photoresist material flows, flow behavior of the photoresist material is influenced by the pattern shape. Especially, as the curvature radius is reduced, much more photoresist material flows.

Figure 2:
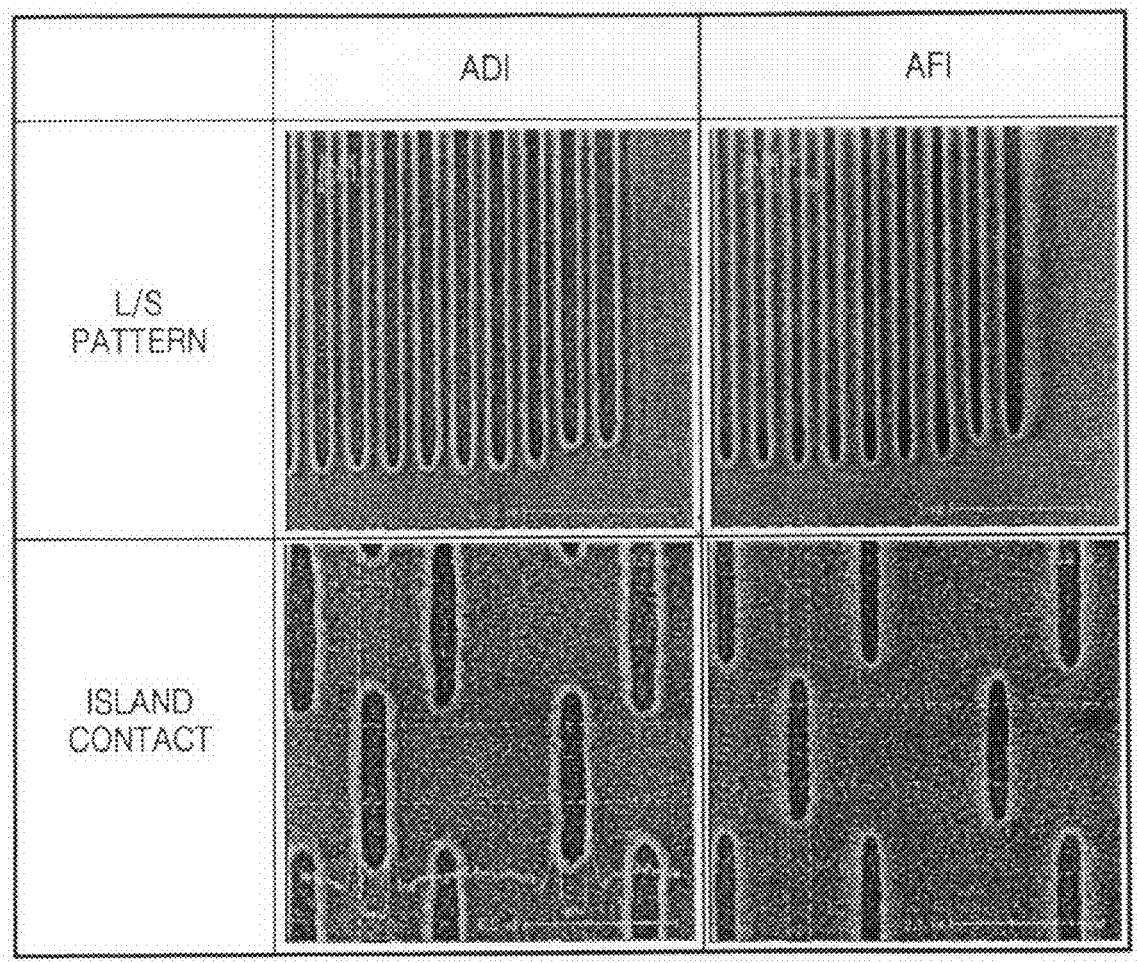
FIG. 2 shows a series of SEM photographs observed through after development inspection (ADI) before flowing a photoresist material and SEM photographs observed through after flow inspection (AFI) after flowing the photoresist material.

FIG. 2 shows a series of SEM photographs observed through after development inspection (ADI) before a photoresist material flows and SEM photographs observed through after flow inspection (AFI) after the photoresist material flows.

As shown in FIG. 2, in a case of the line and space (US) patterns, pattern asymmetry is observed at a dummy line located at the outermost portion (i.e., the rightmost line) in the case of AFI in contrast to the case of ADI. When comparing ADI with AFI in an island contact type pattern, much more flow is generated at an upper portion and a lower portion having a smaller radius of curvature in the respective patterns. Thus, as shown in FIG. 2, it is known that a reduction in a length in a longitudinal vertical axis direction of each pattern is larger than a reduction amount in CD of each pattern in the horizontal direction. From the above result, it is known that a portion having a smaller radius of curvature flows more than a portion having a larger radius of curvature when the resist pattern flows.

As described above, since the first pattern shape portion 102 and the third pattern shape portion 202 have a relatively smaller radius of curvature compared to the second pattern shape portion 104 and the fourth pattern shape portion 204, each first center line 100c of the plurality of first pattern elements 110, 120, 130 and 140 is shifted toward the second pattern shape portion 104 having the relatively larger radius of curvature. Similarly, the second center line 200c of the plurality of second pattern elements 210, 220, 230 and 240 of the second reflow key 200 is shifted toward the fourth pattern shape portion 204 having the relatively larger radius of curvature. As a result, the first center point $C_1$ of the first reflow key 100 moves in the "A" direction and the second center point $C_2$ of the second reflow key 200 moves in the "B" direction. Thus, it is possible to control the flow of the resist pattern arranged on the device region of the semiconductor substrate based on the amount of variation in the position of the first center point $C_1$ of the first reflow key 100 and the amount of variation in the position of the second center point $C_2$ of the second reflow key 200. If necessary, a relationship between the amounts of variation in the positions of the first and second center points $C_1$ and $C_2$ and the flow of the resist pattern can be quantified through a simulation.

The first pattern shape portion 102 of the first pattern elements 110, 120, 130 and 140 and the third pattern shape portion 202 of the second pattern elements 210, 220, 230 and 240 may be formed to have the same radius of curvature. In addition, the second pattern shape portion 104 of the first pattern elements 110, 120, 130 and 140 and the fourth pattern shape portion 204 of the second pattern elements 210, 220, 230 and 240 may be formed to have the same radius of curvature.

Figure 3:
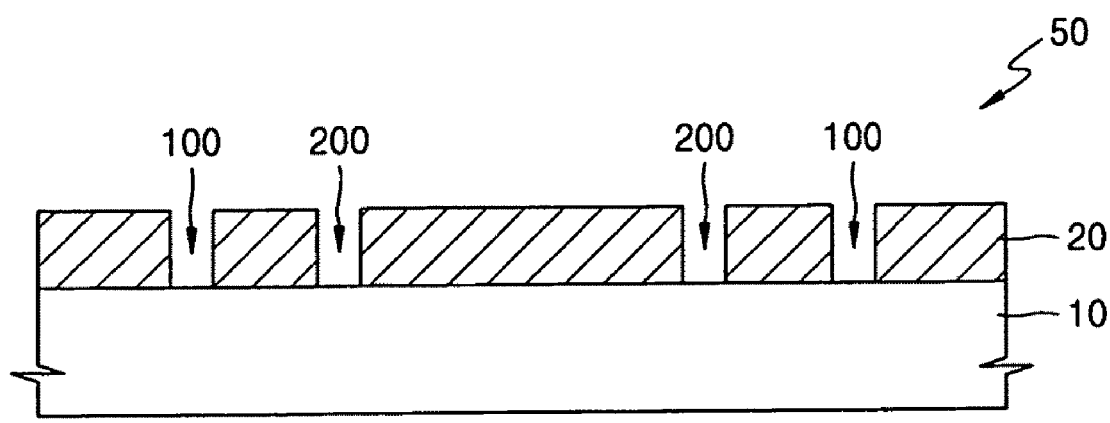
FIG. 3 illustrates a sectional view of a resist reflow measurement key according to an embodiment of the present invention and taken along line II-II' of FIG. 1.

FIG. 3 illustrates a sectional view of the resist reflow measurement key 50 taken along line II-II' of FIG. 1 and shows the first reflow key 100 and the second reflow key 200 being designed in a trench type pattern formed in a resist layer 20 on a semiconductor substrate 10.

Figure 4:
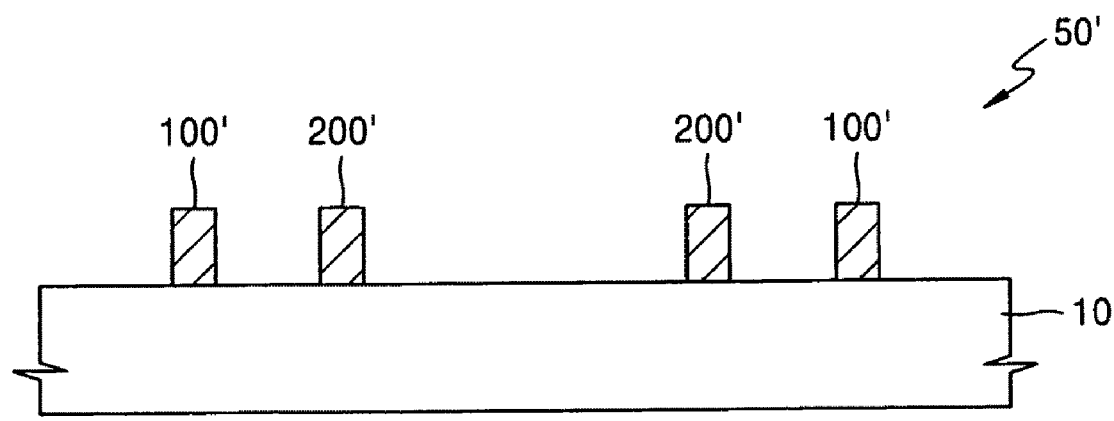
FIG. 4 illustrates a sectional view of a resist reflow measurement key according to another embodiment of the present invention and taken along line II-II' of FIG. 1.

FIG. 4 illustrates a sectional view of an alternate resist reflow measurement key 50' taken along line II-II' of FIG. 1 and shows the first reflow key 100' and the second reflow key 200' being designed in a mesa type pattern on a semiconductor substrate 10.

As shown in FIGS. 3 and 4, in a resist reflow measurement key according to an embodiment of the present invention, the first reflow key 100 and the second reflow key 200 may be designed in a trench type pattern or a mesa type pattern.

Figure 5:
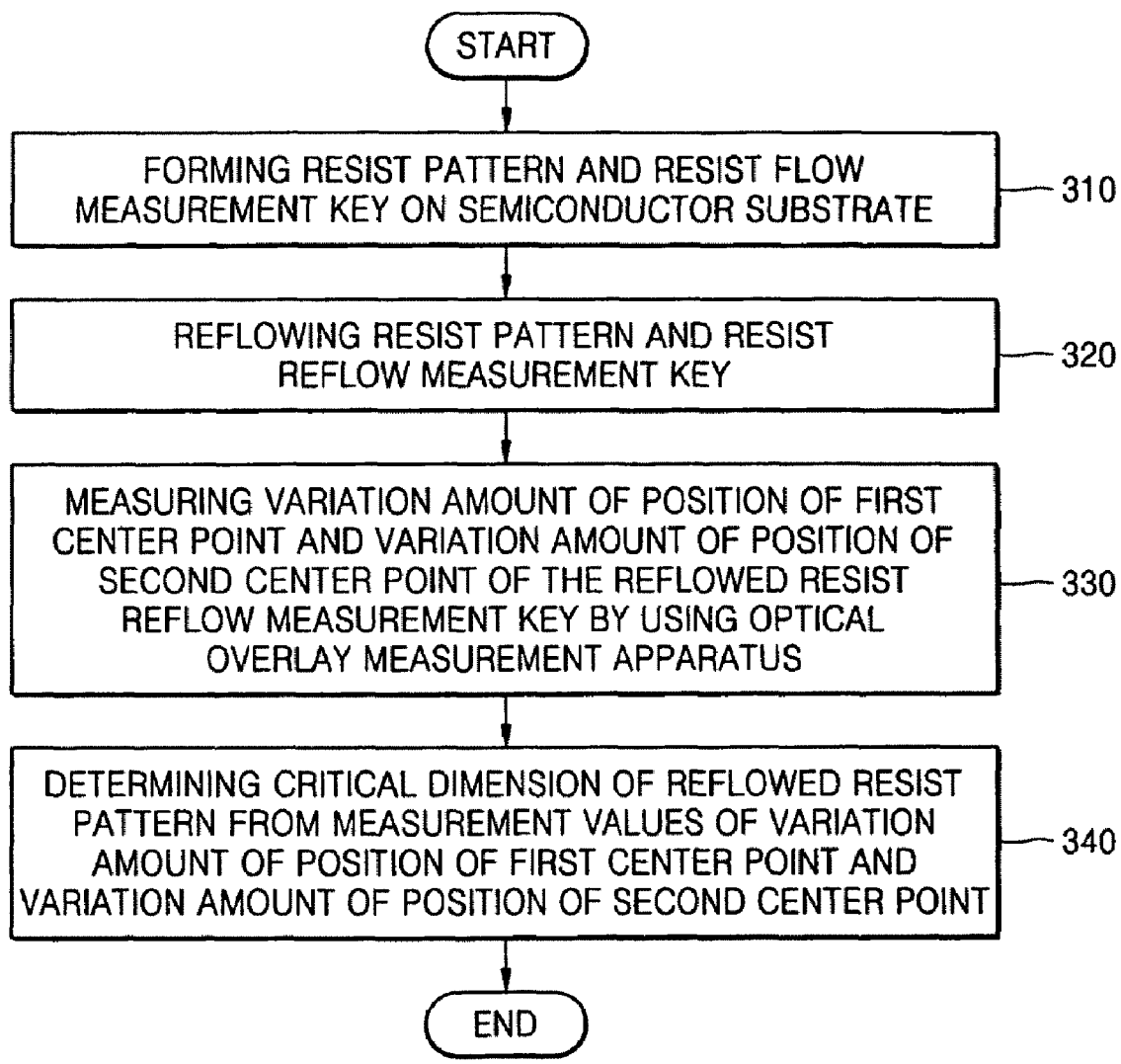
FIG. 5 is a flow chart of a method for forming a fine pattern of a semiconductor device according to an embodiment of the present invention.

FIG. 5 is a flow chart of a method of forming a fine pattern of a semiconductor device according to an embodiment of the present invention.

Referring to FIG. 5, in step 310, a resist pattern is first formed on a semiconductor substrate to form a pattern having a predetermined shape. The resist pattern can be made in any desired pattern, e.g., in a contact hole pattern or in a line and space pattern. Additionally, a resist reflow measurement key 50 according to an embodiment of the present invention as described in connection with FIGS. 1, 3 and 4 is concurrently formed on the semiconductor substrate during the formation of the resist pattern. As described previously, the resist pattern and the resist reflow measurement key 50 may be formed of an identical material. The resist pattern may be formed on a device region of the semiconductor substrate where an actual device is formed. The resist reflow measurement key 50 may be formed at a test element group (TEG) region where a test device for measuring an electrical property of the actual device is formed.

In step 320, the resist pattern and the resist reflow measurement key 50 are reflowed at the same time. At this time, so as to reflow the resist pattern and the resist reflow measurement key 50, the same reaction condition is applied. The reflowing of the resist pattern and the resist reflow measurement key 50 is not limited only to a method using heat, but any reflow method known to those skilled to the art is applicable.

In step 330, a variation in position of the first center point $C_1$ and a variation in position of the second center point $C_2$ of the reflowed resist reflow measurement key 50 are measured by using an optical overlay measurement apparatus, which is generally used for measuring overlay in a semiconductor device fabrication process. This measurement is performed in the general AFI step. Any optical overlay measurement apparatus that is well known to those skilled in the art can be used. For example, in a laser scan alignment (LSA) type overlay measurement apparatus, the resist reflow measurement key 50 is scanned using a short wavelength of laser or a broad band wavelength to read out the center point value of the resist reflow measurement key 50. Alternatively, in a field image alignment (FIA) type overlay measurement apparatus, the shape of the resist reflow measurement key 50 is inputted into a charged coupled display (CCD) like a camera measurement, is read out by signal processing, and a shadow thereof is discriminated to read out the center point value of the resist reflow measurement key 50.

In step 340, a critical dimension (CD) of the reflowed resist pattern is determined from measurement values of the variation in the position of the first center point $C_1$ and the variation in the position of the second center point $C_2$.

The reflow process is controlled such that the flow of the resist pattern is monitored on the basis of the CD value indirectly determined through the resist reflow measurement key 50 in the AFI step according to the aforementioned sequence. This control allows a finally desired CD value of the resist pattern to be obtained.

The resist reflow measurement key according to an embodiment of the present invention includes a first reflow key and a second reflow key each including a plurality of pattern elements having different radii of curvature. The resist reflow measurement key according to an embodiment of the present invention is formed on the same plane as the resist pattern formed on the device region of a semiconductor substrate, and may be formed of an identical material to the resist pattern. Accordingly, after the reflow process of the resist pattern formed on the device region of the wafer is performed, a variation in the positions of the center points on the basis of the flow amount of the resist reflow measurement key reflowed concurrently with the resist pattern is measured in the AFI step using a general overlay measurement apparatus to thereby monitor the CD of the resist pattern.

According to the present invention, it is possible to quantify the flow of the resist pattern placed on the device region by measuring only the resist reflow measurement key in an AFI step. Accordingly, the flow of the resist pattern on the wafer in AFI step can be monitored within a very short time, thereby increasing throughput when performing a process on a large-sized wafer. Also, in the reflow process of the resist pattern, feedback can be rapidly performed, AFI monitoring turn around time (TAT) can be shortened, and the pattern uniformity according to the position on the wafer can be enhanced.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a fine pattern of a semiconductor device, the method comprising:
    forming a resist pattern on a semiconductor substrate to form a pattern having a predetermined shape;
    forming a resist reflow measurement key on the semiconductor substrate while forming the resist pattern;
    reflowing the resist pattern and the resist reflow measurement key at the same time;
    measuring a variation in a position of a first center point of the reflowed resist reflow measurement key and a variation in a position of a second center point of the reflowed resist reflow measurement key; and
    determining a critical dimension of the reflowed resist pattern from measurement values of the variation in the position of the first center point and the variation in the position of the second center point.

2. The method as claimed in claim 1, wherein the pattern having the predetermined shape is a contact hole pattern or a line and space pattern.

3. The method as claimed in claim 1, wherein measuring the variation includes using an optical overlay measurement apparatus, wherein the optical overlay measurement apparatus is a laser scan alignment (LSA) type overlay measurement apparatus or a field image alignment (FIA) type overlay measurement apparatus.

4. The method as claimed in claim 1, wherein the resist pattern and the resist reflow measurement key are formed of an identical material.

5. The method as claimed in claim 1, wherein the semiconductor substrate comprises a device region where an actual device is formed, and a test element group (TEG) region where a test device for measuring an electrical property of the actual device is formed,
    the resist pattern being formed in the device region, and
    the resist reflow measurement key being formed in the TEG region.

6. The method as claimed in claim 1, wherein forming the resist reflow measurement key includes;
    forming a first reflow key around the first center point, the first reflow key including a plurality of first pattern elements each having a first pattern with a first radius of curvature located on a first side of a first center line extending in a lengthwise direction of each of the plurality of first pattern elements and a second pattern with a second radius of curvature located on a second side of the first center line, which is opposite to the first side of the first center line; and
    forming a second reflow key around the second center point, the second reflow key including a plurality of second pattern elements each having a third pattern with a third radius of curvature located on a first side of a second center line extending in a lengthwise direction of each of the plurality of second pattern elements and a fourth pattern with a fourth radius of curvature located on a second side of the second center line, which is opposite to the first side of the second center line, the second reflow key being formed on a same plane as the first reflow key.

7. The method as claimed in claim 6, wherein
  forming the first pattern of each of the plurality of first pattern elements includes forming a plurality of first pattern shape portions positioned at the first side of the first center line and having the first radius of curvature, and the second pattern of each of the plurality of first pattern elements is a plurality of second pattern shape portions positioned at the second side of the first center line and having the second radius of curvature, which is larger than the first radius of curvature, and
  forming the third pattern of the plurality of second pattern elements includes forming a plurality of third pattern shape portions positioned at the first side of the second center line and having the third radius of curvature, and the fourth pattern of the plurality of second pattern elements is a plurality of fourth pattern shape portions positioned at the second side of the second center line and having the fourth radius of curvature, which is larger than the third radius of curvature.

8. The method as claimed in claim 7, wherein
  forming the first pattern includes arranging the plurality of first pattern elements such that the plurality of second pattern shape portions is disposed facing a first direction of a line extending diagonally through the first center point, and
  forming the third pattern includes arranging the plurality of second pattern elements such that the plurality of fourth pattern shape portions is disposed facing a second direction, which is opposite to the first direction, of a line extending diagonally through the second center point.

9. The method as claimed in claim 8, wherein arranging the plurality of first and second pattern elements includes positioning at least one of the plurality of first pattern shape portions of the plurality of first pattern elements to face a corresponding one of the plurality of third pattern shape portions of the plurality of second pattern elements.

10. The method as claimed in claim 9, wherein arranging the plurality of first and second pattern elements includes positioning at least one of the plurality of second pattern shape portions of the plurality of first pattern elements to face a corresponding one of the plurality of fourth pattern shape portions of the plurality of second pattern elements.

11. The method as claimed in claim 8, wherein arranging the plurality of first and second pattern elements includes positioning at least one of the plurality of second pattern shape portions of the plurality of first pattern elements to face a corresponding one of the plurality of fourth pattern shape portions of the plurality of second pattern elements.

12. The method as claimed in claim 7, wherein the first radius of curvature and the third radius of curvature are the same.

13. The method as claimed in claim 7, wherein the second radius of curvature and the fourth radius of curvature are the same.

14. The method as claimed in claim 1, wherein the second reflow key has a size smaller than a size of the first reflow key.

15. The method as claimed in claim 14, wherein the second reflow key is formed in a region defined by the first reflow key.

16. A method of controlling a reflow process on a pattern of a semiconductor device, the method comprising:
  forming a resist pattern on a semiconductor substrate to form the pattern having a predetermined shape;
  forming a resist reflow measurement key on the semiconductor substrate while forming the resist pattern;
  reflowing the resist pattern and the resist reflow measurement key at the same time;
  measuring a variation in a position of a first center point of the reflowed resist reflow measurement key and a variation in a position of a second center point of the reflowed resist reflow measurement key;
  determining a critical dimension of the reflowed resist pattern from measurement values of the variation in the position of the first center point and the variation in the position of the second center point; and
  altering conditions of reflowing in accordance with a determined critical dimension.

17. The method as claimed in claim 16, wherein the pattern having the predetermined shape is a contact hole pattern or a line and space pattern.

18. The method as claimed in claim 16, wherein measuring the variation includes using an optical overlay measurement apparatus.

19. The method as claimed in claim 16, wherein the resist pattern and the resist reflow measurement key are formed of an identical material.

20. The method as claimed in claim 16, wherein the semiconductor substrate comprises a device region where an actual device is formed, and a test element group (TEG) region where a test device for measuring an electrical property of the actual device is formed,
  the resist pattern being formed in the device region, and
  the resist reflow measurement key being formed in the TEG region.

* * * * *